(12) United States Patent
Ishii et al.

(10) Patent No.: US 7,556,719 B2
(45) Date of Patent: Jul. 7, 2009

(54) METHOD OF PRODUCING WIRED CIRCUIT BOARD

(75) Inventors: Jun Ishii, Osaka (JP); Takeshi Yoshimi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 810 days.

(21) Appl. No.: 10/833,063

(22) Filed: Apr. 28, 2004

(65) Prior Publication Data

US 2004/0221447 A1    Nov. 11, 2004

(30) Foreign Application Priority Data

May 7, 2003  (JP) .............................. 2003-128991

(51) Int. Cl.
    *C23C 14/35*  (2006.01)
(52) U.S. Cl. ............................. 204/192.14; 204/192.15; 204/192.17
(58) Field of Classification Search ............ 204/192.14, 204/192.15, 192.17
    See application file for complete search history.

(56) References Cited

U.S. PATENT DOCUMENTS

| | | | | | |
|---|---|---|---|---|---|
| 4,457,950 | A | * | 7/1984 | Fujita et al. | 427/527 |
| 4,568,413 | A | * | 2/1986 | Toth et al. | 156/151 |
| 5,130,274 | A | * | 7/1992 | Harper et al. | 438/624 |
| 6,396,147 | B1 | | 5/2002 | Adachi et al. | |
| 2002/0100609 | A1 | | 8/2002 | Ookawa et al. | |

FOREIGN PATENT DOCUMENTS

| | | | |
|---|---|---|---|
| JP | 64-47845 | | 2/1989 |
| JP | 5-218660 | | 8/1993 |
| JP | 06-13754 | * | 1/1994 |
| JP | 08-153940 | | 11/1996 |
| JP | 11-340471 | | 12/1999 |
| JP | 2001-328199 A | | 11/2001 |
| JP | 2002-222578 | | 8/2002 |
| WO | WO 02/081402 A2 | | 10/2002 |

OTHER PUBLICATIONS

Machine Translation of 06-013754 dated Jan. 1994.*

* cited by examiner

*Primary Examiner*—Rodney G McDonald
(74) *Attorney, Agent, or Firm*—Jean C. Edwards, Esq.; Akerman Senterfitt

(57) ABSTRACT

A method of producing a wired circuit board that can prevent the electrostatic damage of the components mounted on the wired circuit board effectively, while preventing operation errors of the device caused by the static electricity. After a thin metal film is formed over an entire area of a front side of an insulating cover layer and an entire surface of a conductor layer at a terminal portion thereof by sputtering, a metal oxide layer is formed on the thin metal layer by an oxidation-by-heating method or by the sputtering. According to this method, since the semi-conductor layer comprising the thin metal film and the metal oxide layer is formed on the surface of the insulating cover layer, the electrostatic damage of the components mounted on the wired circuit board can be prevented effectively. Also, the operation errors of the device caused by the construction wherein only the thin metal film is formed can also be prevented effectively. Further, the semi-conductor layer having a uniform surface resistance which falls within a preferable range can be formed, as compared with the construction wherein the metal oxide layer is formed directly on the insulating cover layer by the reactive sputtering or by the sputtering using the metallic oxide target.

8 Claims, 3 Drawing Sheets

METHOD OF PRODUCING WIRED CIRCUIT BOARD

This application claims priority from Japanese Patent Application No.2003-128991, filed May 7, 2003, the entire contents of which are herein incorporated by reference to the extent allowed by law.

BACKGROUND OF THE INVENTION

1. Field of the Invention

The present invention relates to a method of producing a wired circuit board and, more particularly, to a method of producing a wired circuit board used for electric devices and electronic devices.

2. Description of the Prior Art

In general, a wired circuit board, such as a flexible wired circuit board, widely used for a variety of electric devices and electronic devices, is formed, for example, by laminating an insulating layer of polyimide resin or the like on either side or both sides of a conductor layer of a copper foil and the like.

However, when components are mounted on this wired circuit board, the components are sometimes damaged by static electricity developed in the mounting process.

For solving this electrostatic damage problem, a method is proposed by Japanese Laid-open (Unexamined) Patent Publication No. Hei 8(1996)-153940, for example, according to which a metal layer is formed on the insulating layer by vapor deposition, sputtering, or electroless plating, in order to discharge the static electricity in an electrostatically grounded manner or reduce the static electricity.

This method has the advantage that the metal layer formed on the surface of the insulating layer can allow significant reduction of a surface resistance value to protect the components against the electrostatic damage, while on the other hand, it has the disadvantage that the significant reduction of the surface resistance value may cause operation errors of the device more often.

SUMMARY OF THE INVENTION

It is the object of the invention to provide a method of producing a wired circuit board that can prevent the electrostatic damage of the components mounted on the wired circuit board effectively, while preventing operation errors of the device.

The present invention provides a novel method of producing a wired circuit board comprising the step of preparing a wired circuit board comprising a conductor layer and an insulating layer located adjacent to the conductor layer, the step of forming a thin metal film on a surface of the insulating layer, and the step of forming a metal oxide layer on a surface of the thin metal film.

In this method, it is preferable that the thin metal film is formed by sputtering in the step of forming the thin metal film on the surface of the insulating layer.

In this method, it is preferable that the metal oxide layer is formed by oxidizing the surface of the thin metal film by heating in the step of forming the metal oxide layer on the surface of the thin metal film.

In this method, it is also preferable that the metal oxide layer is formed by sputtering in the step of forming the metal oxide layer on the surface of the thin metal film.

Also, the present invention includes a method of producing a wired circuit board comprising the step of preparing a wired circuit board comprising a conductor layer, an insulating layer located adjacent to the conductor layer, and a terminal portion formed by the conductor layer exposed by opening the insulating layer, the step of forming a thin metal film on a surface of the insulating layer and a surface of the terminal portion, the step of forming a metal oxide layer on a surface of the thin metal film, and the step of removing the thin metal layer and metal oxide layer formed on the surface of the terminal portion.

In this method, it is preferable that the thin metal layer is formed by sputtering in the step of forming the thin metal film on the surface of the insulating layer and the surface of the terminal portion.

In this method, it is preferable that the metal oxide layer is formed by oxidizing a surface of the metal oxide layer by heating in the step of forming the metal oxide layer on the surface of the thin metal film.

In this method, it is also preferable that the metal oxide layer is formed by sputtering in the step of forming the metal oxide layer on the surface of the thin metal film.

According to the method of producing a wired circuit board of the present invention, since the semi-conductor layer comprising the thin metal film and the metal oxide layer is formed on the surface of the insulating layer, the electrostatic damage of the components mounted on the wired circuit board can be prevented effectively. Besides, differently from the case where only the thin metal film is formed, excessive reduction of the value of the surface resistance can be prevented and accordingly the operation errors of the device can also be prevented effectively.

Further, the semi-conductor layer having a uniform surface resistance value which falls within a preferable range can be formed, as compared with the construction wherein the metal oxide layer is formed directly on the surface of the insulating layer by the reactive sputtering or by the sputtering using the metallic oxide target.

Figure 1:
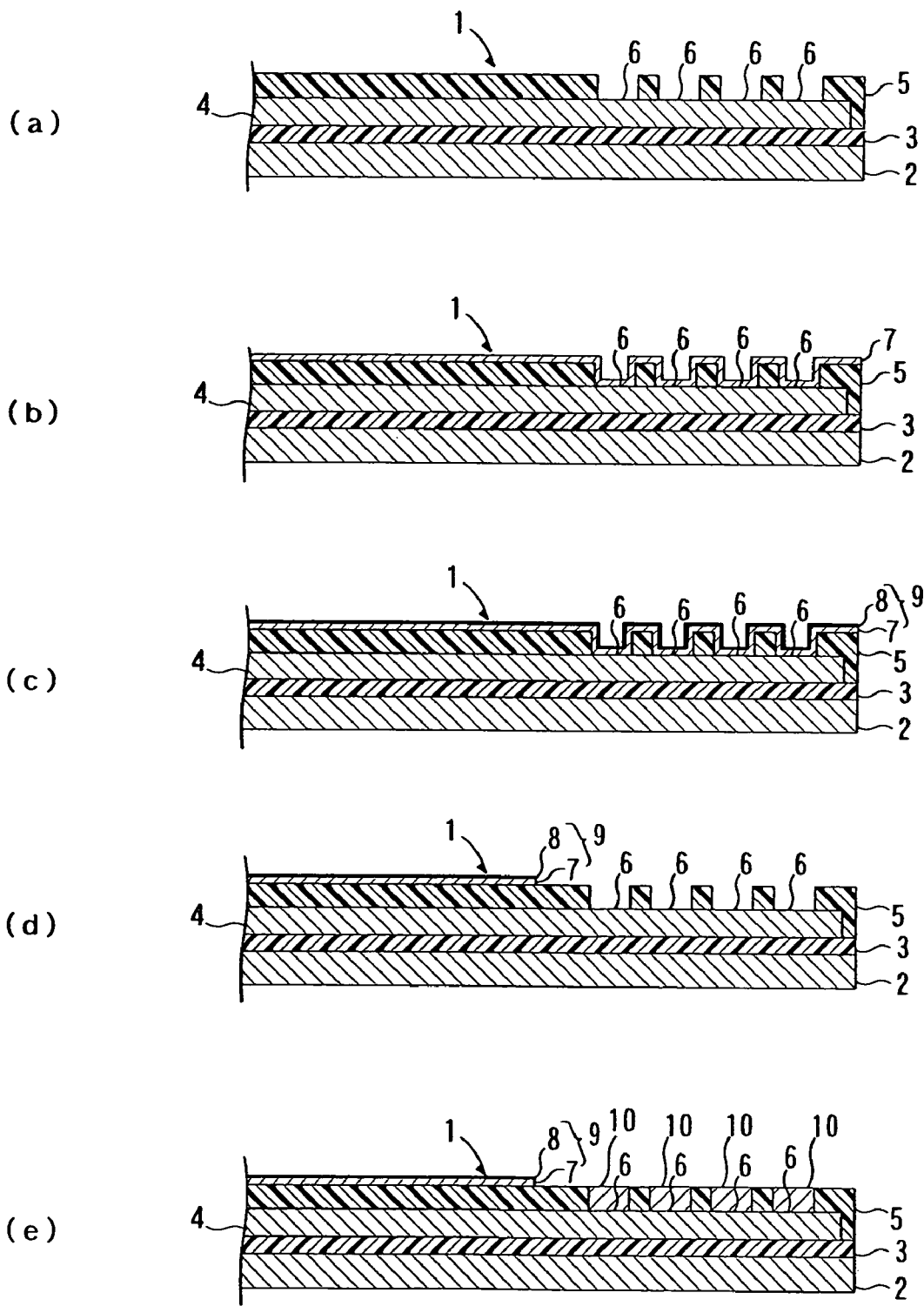
FIG. 1 shows in section the production processes of a suspension board with circuit taken as an embodiment of a method of producing a wired circuit board of the present invention.
Figure 2:
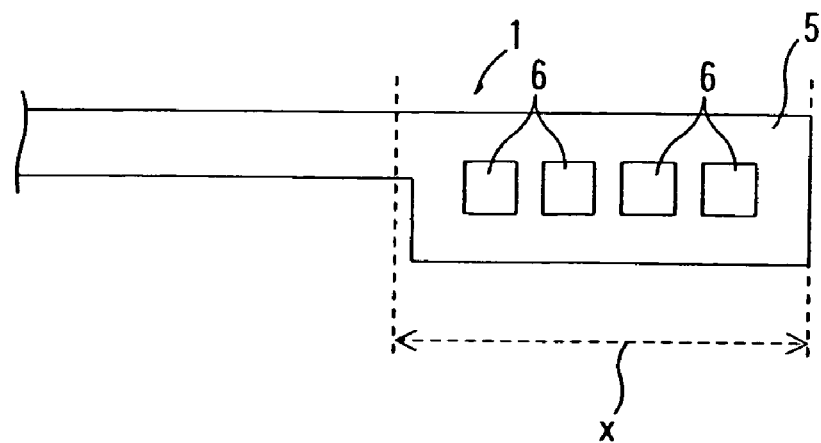
Figure 3:
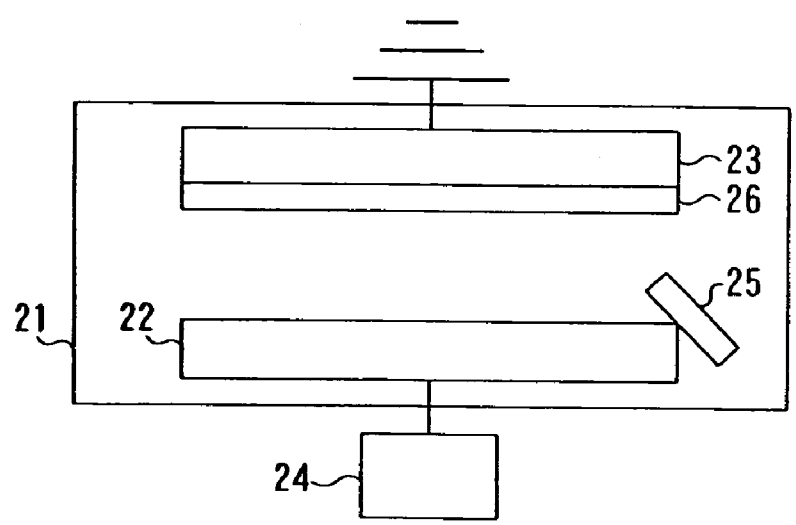
Figure 4:
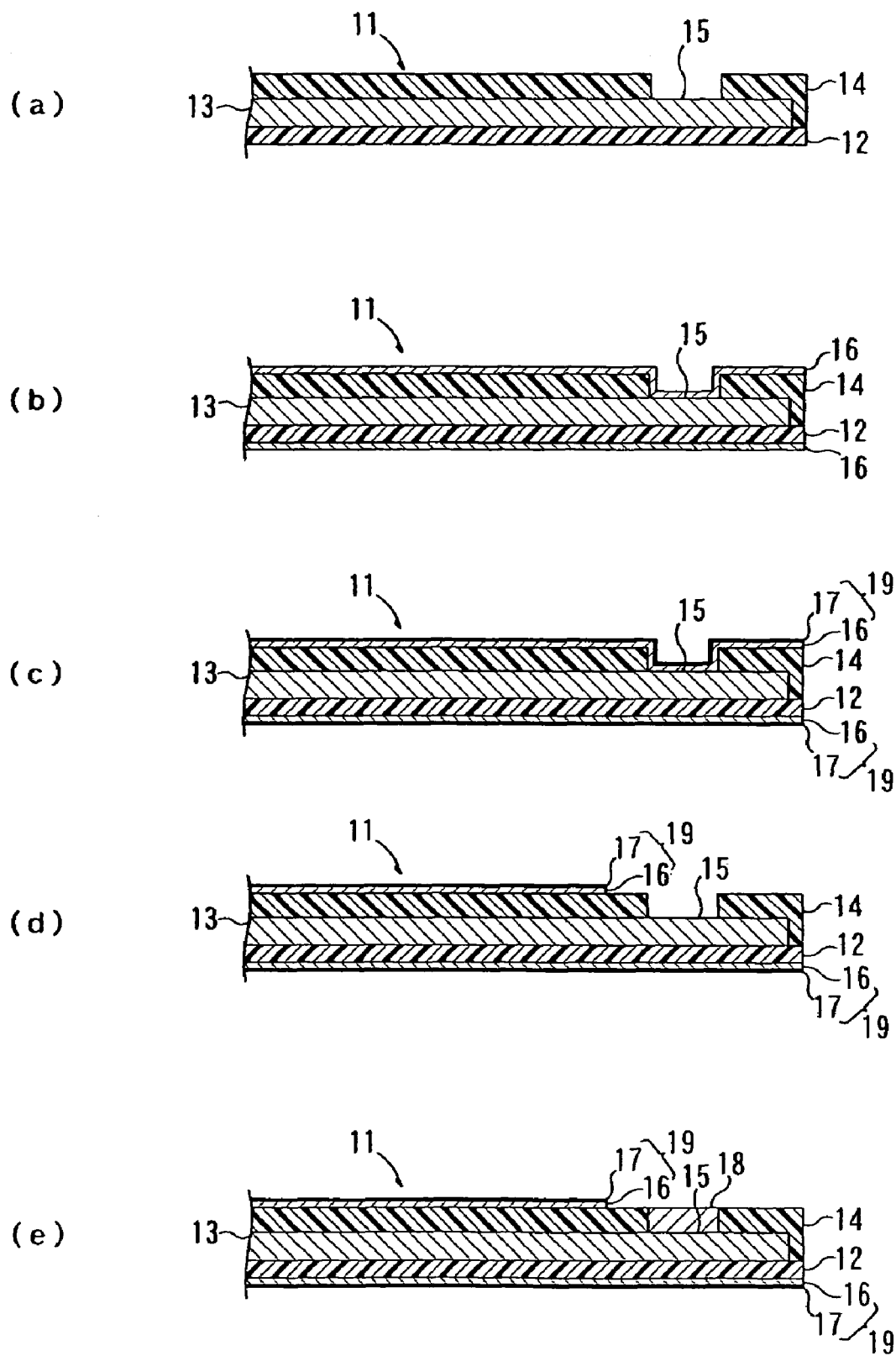

(a) shows the step of preparing the suspension board with circuit;

(b) shows the step of forming a thin metal film over an entire surface of an insulating cover layer and an entire surface of a terminal portion of the suspension board with circuit;

(c) shows the step of forming a metal oxide layer on the entire area of the front side of the thin metal film;

(d) shows the step of removing the thin metal film and metal oxide layer formed in the terminal portion and a neighboring portion thereof, and (e) shows the step of forming a pad portion in the terminal portion, FIG. 2 is a plan view of the terminal portion of the suspension board with circuit shown in FIG. 1, FIG. 3 is a schematic view showing the structure of a sputtering apparatus in an embodiment of the present invention, and FIG. 4 shows in section the production processes of a flexible wired circuit board taken as an embodiment of the method of producing the wired circuit board of the present invention:

(a) shows the step of preparing the flexible wired circuit board;

(b) shows the step of forming a thin metal film over a surface of an insulating base layer and the insulating cover layer of the flexible wired circuit board;

(c) shows the step of forming a metal oxide layer on the entire surface of the thin metal film;

(d) shows the step of removing the thin metal film and metal oxide layer formed in the terminal portion and a neighboring portion thereof, and (e) shows the step of forming a pad portion in the terminal portion.

DETAILED DESCRIPTION OF THE PREFERRED EMBODIMENTS

In the producing method of a wired circuit board according to the present invention, a wired circuit board is prepared, first. The wired circuit board prepared may be in any known form, such as a single-sided flexible wired circuit board, a double-sided flexible wired circuit board, a multilayer flexible wired circuit board, and a suspension board with circuit, without any particular limitation on the form, as long as it has an insulating layer at an outermost side thereof and a conductor layer located adjacent to the insulating layer. In the wired circuit board, the conductor layer has a predetermined wired circuit pattern formed by a known patterning process, such as a subtractive process, an additive process, or a semi-additive process.

Usually, this wired circuit board has a terminal portion to be electrically connected with external circuits or electronic components. The terminal portion can be provided in the form of the conductor layer by opening a prescribed area of the insulating layer formed at the outermost layer by a known process, e.g., by etching, patterning, or drilling, to expose the conductor layer from the opening formed.

Referring to FIG. 1 showing in section the production processes of a suspension board with circuit taken as an embodiment of a method of producing a wired circuit board of the present invention, the method of producing the suspension board with circuit will be described below.

In this method, a suspension board with circuit 1 is prepared, first, as shown in FIG. 1(a).

The suspension board with circuit 1 comprises a metal supporting layer 2, an insulating base layer 3 formed on the metal supporting layer 2, a conductor layer 4 formed on the insulating base layer 3, and an insulating cover layer 5 provided as an insulating layer formed on the conductor layer 4.

For example, the suspension board with circuit 1 can be produced in the following manner. First, liquid solution comprising photosensitive polyamide acid resin is applied to a surface of the metal supporting layer 2 formed by a stainless foil and the like. Then, the liquid solution is exposed to light and developed, to form a predetermined pattern and then is heated and cured, to form the insulating base layer 3 comprising polyimide resin on the metal supporting layer 2. Sequentially, the conductor layer 4 is formed in the form of a predetermined wired circuit pattern on the insulating base layer 3 by the semi-additive process. Thereafter, the liquid solution comprising photosensitive polyamide acid resin is applied to a surface of the insulating base layer 3 including a surface of the conductor layer 4. Then, the liquid solution is exposed to light and developed, to form a predetermined pattern and then is heated and cured, to form the insulating cover layer 5 comprising polyimide resin on the insulating base layer 3 including the conductor layer 4.

In this suspension board with circuit 1, the insulating cover layer 5 is opened to provide the terminal portions 6 (See FIG. 2). The terminal portions 6 can be provided, for example, in the manner that when the insulating cover layer 5 is formed, the photosensitive polyamide acid resin is formed into a specific pattern so that areas of the conductor layer 4 corresponding to the terminal portions 6 can be exposed.

Then, a thin metal film 7 is formed over an entire surface of the insulating cover layer 5 and an entire surface of the terminal portions 6, as shown in FIG. 1(b).

The metals that may be used for forming the thin metal film 7 include, for example, chromium, nickel, aluminum, titanium, tantalum, tin, zinc, zirconium, silicon, gallium, indium, and alloys thereof, though no particular limitation is imposed thereon. Chromium is preferably used as the material of the thin metal film 7. An oxide layer of chromium can provide a steady surface-resistance value that does not vary substantially even under a high-temperature and high-humidity environment.

Thickness of the thin metal film 7 is set to be in the range of e.g. 3-1,000 nm, or preferably 5-500 nm. The thin metal film 7 having a more thickness sometimes provides the disadvantageous result that even when a metal oxide layer 8 is formed on a surface of the thin metal film 7, it resists increase in the surface resistance value. On the other hand, the thin metal film 7 having a less thickness sometimes provides the disadvantageous result that the thin metal film 7 may be oxidized thoroughly in the thickness direction and turned into an insulator when oxidized by heating in a later process.

The thin metal film 7 can be formed by a known physical vapor deposition (PVD) methods, such as sputtering, vacuum deposition, or ion plating, though it is not necessarily limited thereto. The sputtering is preferably used in terms of high degree of adhesion to the insulating cover layer 5.

For example, a sputtering apparatus shown in FIG. 3 is used for the sputtering. In the sputtering apparatus, a target 22 (a metal used for forming the thin metal film 7) and an earth electrode 23 are arranged opposite to each other at a predetermined space in a vacuum chamber 21, as shown in FIG. 3. A power source 24 is connected to the target 22, and a plasma emission monitor 25 is arranged to emit plasma to the target 22. A pulsed power source, a DC power source, an AC power source, etc. may be used as the power source 24, though no particular limitation is imposed on the power source.

The earth electrode 23 is electrically grounded, and a board 26 is placed on the earth electrode 23. It is to be noted that the board 26 is the suspension board with circuit 1 prepared in the process of FIG. 1(a). A portion of the board 26 on the side thereof on which the insulating cover layer 5 including the terminal portions 6 is provided is arranged opposite to the target 22.

Then, after an inert gas, such as argon gas, is introduced into the vacuum chamber 21, an electric power is applied to the target 22 from the power source 24, so that the target 22 is sputtered for a predetermined time while the plasma emission intensity is maintained at a constant value by the plasma emission monitor 25. In this sputtering, the thin metal film 7 is formed on the entire surface of the insulating cover layer 5 and the entire surface of the terminal portions 6.

An example of the sputtering conditions for forming the thin metal film 7 is given below.

Ultimate vacuum: $1.33 \times 10^{-5}$ Pa to $1.33 \times 10^{-2}$ Pa

Flow rate of introduced gas (Argon): $1.2 \times 10^{-3}$ m$^3$/h to $2.4 \times 10^{-3}$ m$^3$/h Operating pressure (Degree of vacuum after introduction of introduced gas): $1.33 \times 10^{-2}$ Pa to 1.33 Pa Temperature of earth electrode: 10° C.-100° C.

Electric power: 100W-400W

Sputtering time: 15 sec. to 15 min.

In the sputtering, it is necessary to control various factors, such as degree of vacuum, purity of the target 22, electric power to be applied to the target 22 from the power source 24, film thickness, flow rate of introduced gas, and plasma emission intensity. It is particularly important to control the film thickness and the plasma emission intensity. For example, the plasma emission intensity has a specific emission spectrum (conformation spectrum) to be distinguished according to the kinds of metals used for the target 22, as shown in TABLE 1. Accordingly, the thin metal layer 7 can be produced as a film having high reproducibility by controlling the flow rate of the introduced gas in such a manner that the plasma emission intensity can be maintained at a constant value.

TABLE 1

| Metal | Conformation spectrum (nm) |
|---|---|
| Al | 396.1 |
| Ti | 453.4 |
| Ta | 481.2 |
| Cr | 425.4 |
| Sn | 326.2 |
| Zn | 330.2 |
| Zr | 361 |
| Si | 251.6 |
| Ni | 349.2 |
| In | 451.1 |

The plasma emission intensity is controlled by a set point of the plasma emission monitor 25. This control is made in the following manner. The plasma emission intensity prior to the gas introduction is taken as 90% and the relative value is set as the set point.

In this sputtering, an adequate sputtering is selected from known sputtering methods, such as DC sputtering, RF sputtering, magnetron sputtering, or combination thereof.

In the vacuum deposition, for example, the material deposited (metal) and the board (the suspension board with circuit 1) are placed opposite to each other at a given space in the vacuum chamber. The material deposited is deposited on the entire surface of the insulating cover layer 5 and the entire surface of the terminal portions 6 in vacuum in a heating method, such as resistive heating, crucible external heating, electron-beam heating, high-frequency heating or laser heating, to form the thin metal film 7.

In the ion plating, for example, the material deposited (metal) and the board (the suspension board with circuit 1) are placed opposite to each other at a given space in the vacuum chamber. Then, the inert gas serving as a plasma gas, such as argon gas, is introduced into the vacuum chamber, so that the plasma discharge is generated in the vacuum by an electric discharge method, such as a DC discharge excitation method, a high-frequency discharge excitation method, a hollow cathode discharge method or an arc discharge method, to form the thin metal film 7 on the entire surface of the insulating cover layer 5 and the entire surface of the front side of the terminal portions 6.

Sequentially, the metal oxide layer 8 is formed on the entire surface of the thin metal film 7, as shown in FIG. 1(c).

The metal oxide layer 8 is formed, for example, by an oxidation-by-heating method or by the sputtering, though no particular limitation is imposed on the method.

In the oxidation-by-heating method, the surface of the thin metal film 7 is oxidized by heating, so that the metal oxide layer 8 is formed on the thin metal film 7. No particular limitation is imposed on the way of heating. For example, the thin metal film 7 may be heated in a heating furnace in the atmosphere. The heating temperature is preferably in the range of e.g. 50° C.-400° C., or preferably 100° C.-250° C., and the heating time is preferably in the range of e.g. one minute to twelve hours. In this method, a very thin metal oxide layer 8 is formed on the surface of the thin metal film 7.

Although this metal oxide layer 8 formed by heating is very thin, the production of the metal oxide layer 8 can be confirmed by ESCA, AES (Auger electron spectroscopy), SIMS (secondary ion mass spectrometry), and the like.

The metal oxide layer 8 thus formed has a very large value of electric resistance, while on the other hand, the thin metal film 7 has a very small value of electric resistance. Accordingly, a semi-conductor layer 9 can be formed by combination of the thin metal film 7 and the metal oxide layer 8.

In the sputtering, a reactive sputtering is preferably used. In the reactive sputtering, the same processes as those of the sputtering mentioned above can be taken, except that the introduced gas comprising oxygen is introduced into the vacuum chamber 21 of the sputtering apparatus shown in FIG. 3.

To be more specific, the same metal (target 22) as the metal used for forming the thin metal film 7 mentioned above is set in place and also the suspension board with circuit 1 (board 26) including the thin metal film 7 is set in place so that a portion of the suspension board with circuit 1 on the side thereof on which the thin metal film 7 is provided confronts the target 22.

Then, after a reactive gas wherein argon or nitrogen, and oxygen of an essential gas are mixed in a given proportion (e.g. $Ar/O_2$ mixed gas, $N_2/O_2$ mixed gas) is introduced in the vacuum chamber 21, an electric power is applied to the target 22 from the power source 24, so that the target 22 is sputtered for a predetermined time while the plasma emission intensity is maintained at a constant value by the plasma emission monitor 25. In this reactive sputtering, the metal oxide layer 8 is formed on the entire surface of the thin metal film 7.

An example of the reactive sputtering conditions for forming the metal oxide layer 8 is given below.

Ultimate vacuum: $1.33 \times 10^{-5}$ Pa to $1.33 \times 10^{-2}$ Pa

Flow rate of introduced gas:

(For $Ar/O_2$ mixed gas)

Ar: $1.2 \times 10^{-3}$ m$^3$/h to $2.4 \times 10^{-3}$ m$^3$/h $O_2$: $6 \times 10^{-5}$ m$^3$/h to $30 \times 10^{-5}$ m$^3$/h (For $N_2/O_2$ mixed gas)

$N_2$: $1.2 \times 10^{-3}$ m$^3$/h to $2.4 \times 10^{-3}$ m$^3$/h $O_2$: $6 \times 10^{-5}$ m$^3$/h to $30 \times 10^{-5}$ m$^3$/h Operating pressure (Degree of vacuum after introduction of introduced gas): $1.33 \times 10^{-2}$ Pa to 1.33 Pa Temperature of earth electrode: 10° C.-100° C.

Electric power: 100 W-400 W

Sputtering time: 15 sec. to 3 min.

In this reactive sputtering, it is particularly important to control the flow rate of introduced gas of oxygen and the sputtering time. The metal oxide layer 8 having a large value of electric resistance can be formed uniformly by controlling these factors adequately. The metal oxide layer 8 has a thickness of e.g. 2-30 nm when produced by this reactive sputtering.

Also, the metal oxide layer 8 can have a uniform thickness and a large value of surface resistance (specifically, $10^{10}\Omega/\square$-$10^{13}\Omega/\square$) when formed in the conditions for the reactive sputtering mentioned above. These were confirmed by the pilot study. On the other hand, the thin metal film 7 has a small value of surface resistance (specifically, in the order of $10^2\Omega/$ $\square$-$10^3\Omega/\square$) before the metal oxide layer 8 is formed thereon. Accordingly, the semi-conductor layer 9 can be formed by combination of the thin metal film 7 and the metal oxide layer 8, as in the case mentioned above.

Instead of the reactive sputtering, a common sputtering using metallic oxide as the target can be used to form the metal oxide layer 8.

In the sputtering using metallic oxide as the target, e.g. $CrO_2$, $ZrO_2$, $SiO_2$, $SnO_2$, $TiO_2$, $Al_2O_3$, and MgO are used as the metallic oxide target. $CrO_2$ is preferably used. In this sputtering, the same processes as those of the sputtering mentioned above can be used, except that the power source used in the sputtering apparatus shown in FIG. 3 is limited to the AC power source (RF).

To be more specific, as a substitute for the metal target used for forming the thin metal film 7 mentioned above, the metallic oxide target used as the target 22 is set in place and also the suspension board with circuit 1 (board 26) including the thin metal film 7 is set in place so that a portion of the suspension board with circuit 1 on the side thereof on which the thin metal film 7 is provided confronts the target 22.

Then, after argon or nitrogen is introduced in the vacuum chamber 21, an electric power is applied to the target 22 from the power source 24, so that the target 22 is sputtered for a predetermined time while the plasma emission intensity is maintained at a constant value by the plasma emission monitor 25. In this sputtering as well, the metal oxide layer 8 is formed on the entire surface of the thin metal film 7.

An example of the sputtering conditions for forming this metal oxide layer 8 is given below.

Ultimate vacuum: $1.33\times10^{-5}$ Pa to $1.33\times10^{-2}$ Pa
Flow rate of introduced gas:
(For Ar gas)

Ar: $1.2\times10^{-3}$ m$^3$/h to $2.4\times10^{-3}$ m$^3$/h (For $N_2$ gas)

$N_2$: $1.2\times10^{-3}$ m$^3$/h to $2.4\times10^{-3}$ m$^3$/h

Operating pressure (Degree of vacuum after introduction of introduced gas): $1.33\times10^{-2}$ Pa to 1.33 Pa
Temperature of earth electrode: 10° C.-100° C.
Electric power: 100 W-1000 W
Sputtering time: 15 sec. to 3 min.

In this sputtering, it is important to control the sputtering time. The metal oxide layer 8 having a large value of electric resistance can be formed by controlling the sputtering time adequately. The metal oxide layer 8 has a thickness of e.g. 2-30 nm when produced by this sputtering using the metallic oxide target.

Also, the metal oxide layer 8 can have a uniform thickness and a large value of surface resistance (specifically, $10^{10}\Omega/\square$-$10^{13}\Omega/\square$) when formed in the conditions cited above for the sputtering using the metallic oxide target. These were confirmed by the pilot study. On the other hand, the thin metal film 7 has a small value of electric resistance (specifically, in the order of $10^2\Omega/\square$-$10^3\Omega/\square$) before the metal oxide layer 8 is formed thereon. Accordingly, the semi-conductor layer 9 can be formed by combination of the thin metal film 7 and the metal oxide layer 8, as in the case mentioned above.

The value of surface resistance of the semi-conductor layer 9 formed by the oxidation-by-heating method or by the sputtering is taken as a mean value of the thin metal film 7 of a small value of electric resistance and metal oxide layer 8 of a large value of electric resistance. It is preferable that the mean value is in the range of $10^4\Omega/\square$-$10^{10}\Omega/\square$). When the value of surface resistance of the semi-conductor layer 9 is less than $10^4\Omega/\square$, there is the possibility that when pad portions 10 are formed in the terminal portions 6 by plating, as mentioned layer, the surface of the metal oxide layer 8 may also be plated to cause operation errors of the components mounted.

It is to be noted that the unit of surface resistance is commonly expressed as ($\Omega/\square$).

In this method, the thin metal film 7 and the metal oxide layer 8 formed on the surface of the terminal portions 6 are removed for conduction or continuity between the terminal portions 6 and the components mounted on the terminal portions 6, as shown in FIG. 1(d).

For example the etching method is preferably used for removal of the thin metal film 7 and the metal oxide layer 8, though it is not necessarily limited thereto.

In the etching method, an etching resist is formed on all areas of the suspension board with circuit 1 but the terminal portions 6 and the neighboring portions thereof, first. Then, the metal oxide layer 8 and thin metal film 7 corresponding to the terminal portions 6 and neighboring portions thereof (a surface of the insulating cover layer 5 including land portions between the terminal portions 6 and surrounding areas thereof as is depicted as a region X by a dotted line in FIG. 2) is removed by use of etchant (etching solution).

A proper etchant can be selected for the kind of metal of the metal oxide layer 8 and thin metal film 7. For example, potassium-ferricyanide-based etchant, potassium-permanganate-based etchant, sodium-metasilicate-based etchant, cerium-ammon-nitrate-based etchant, hydrochloride-based etchant, sulfate-based etchant, and nitrate-based etchant may be used for chromium of the metal oxide layer 8 and thin metal film 7.

Also, the etching resist may be previously formed at the terminal portions 6 and the neighboring portions thereof when the thin metal film 7 is formed, but the presence of the etching resist may produce a possible problem that when the thin metal film 7 is formed by sputtering, gas may be generated from the etching resist to cause reduction in the degree of vacuum of the vacuum chamber 21. For this reason, it is preferable that after the thin metal film 7 and the metal oxide layer 8 are formed, their portions corresponding to the terminal portions 6 and the neighboring portions thereof are removed.

For the suspension board with circuit 1 wherein the conductor layer 4 corresponding to the terminal portions 6 comprises copper, the thin metal film 7 formed thereon comprises chromium, and the thin chromium film of the thin metal film 7 has minute holes through which the copper of a ground sheet of the conductor layer 4 is exposed, the etchant that dissolves the copper but does not dissolve the chromium (e.g. the sulfate-based-etchant, the hydrogen-peroxide-based-etchant, or the hydrochloride-based-etchant) can be used to dissolve the copper of the surface of the conductor layer 4 through the minute holes, without dissolving the chromium of the thin metal film 7. This enables the chromium of the portions of the thin metal film 7 and metal oxide layer 8 to be removed from those portions where the copper was dissolved, without using any etching resist.

Although the method in which after the metal oxide layer 8 is formed, the thin metal film 7 and the metal oxide layer 8 are removed has been described above, the thin metal film 7 may be removed by etching before the metal oxide layer 8 is formed. The latter method has the advantage that the thin metal film 7 is dissolved in a variety of etchants more readily than the metal oxide layer 8.

Then, the pad portions 10 are formed, for example, by electrolytic-plating the terminal portions 6, from which the thin metal film 7 and the metal oxide layer 8 were removed, with nickel and gold in sequence, as shown in FIG. 1(e).

Thereafter, the metal supporting layer 2 is etched into a predetermined shape (not shown) to thereby produce the suspension board with circuit 1 having the thin metal film 7 and metal oxide layer 8 formed thereon.

According to this method, since the semi-conductor layer 9 comprising the thin metal film 7 and the metal oxide layer 8 is formed on the insulating cover layer 5, the electrostatic damage of the components mounted on the suspension board with circuit 1 can be prevented effectively. Besides, differently from the case where only the thin metal film 7 is formed, excessive reduction of the value of the surface resistance can be prevented and accordingly the operation errors of the device can also be prevented effectively.

Meanwhile, for example when the metal oxide layer 8 is formed directly on the insulating cover layer 5 by the reactive sputtering, oxygen concentration in the vacuum chamber 21 is not necessarily uniformed. Due to this, even minor changes in the flow rate of oxygen of the introduced gas cause a large variation in surface resistance, thus causing variation in surface resistance of the metal oxide layer 8 formed. On the other hand, when the flow rate of the oxygen of the introduced gas is increased and also the sputtering time is shorten, the variation in surface resistance is reduced, but the surface resistance itself is significantly increased beyond an upper limit ($10^{10}\Omega/\square$) of a desirable range of the semi-conductor layer 9. In addition, when the metal oxide layer 8 is formed directly on the insulating cover layer 5 by the sputtering using the metallic oxide target, the surface resistance itself is significantly increased beyond an upper limit ($10^{10}\Omega/\square$) of the desirable range of the semi-conductor layer 9.

However, when the thin metal film 7 and the metal oxide layer 8 are formed in sequence on the insulating cover layer 5, as mentioned above, the semi-conductor layer 9 having a uniform surface resistance which falls within the preferable range of $10^4\Omega/\square$-$10^{10}\Omega/\square$ can be formed.

Although the method of producing the wired circuit board of the present invention has been taken as an example of the method of producing the suspension board with circuit 1, the present invention is never limited to the illustrated embodiment. For example, the present invention is applicable to a method of producing a flexible wired circuit board 11, as shown in FIG. 4.

In FIG. 4, the flexible wired circuit board 11 comprising a conductor layer 13 formed in a predetermined wired circuit pattern on an insulating base layer 12 and an insulating cover layer 14 formed on the insulating base layer 12 including the conductor layer 13 is prepared, first, as shown in FIG. 4(a). This flexible wired circuit board 11 can be formed, for example, in the manner that after the conductor layer 13 of a two-layer substrate comprising the insulating base layer 12 and the conductor layer 13 formed thereon is formed in a predetermined wired circuit pattern by a subtractive process, the insulating cover layer 14 is laminated on the two-layer substrate. In this flexible wired circuit board 11, the insulating cover layer 14 is opened, so that the conductor layer 13 is exposed therefrom. The conductor layer 13 thus exposed serves as the terminal portions 15.

Sequentially, thin metal films 16 are formed on the insulating base layer 12 and on the insulating cover layer 14 including the terminal portions 15, respectively, in the same manner as in the above-mentioned case, as shown in FIG. 4(b). Then, after metal oxide layers 17 are formed on the thin metal films 16, respectively, in the same manner as in the above-mentioned case, as shown in FIG. 4(c), the thin metal film 16 and the metal oxide layer 17 formed at the terminal portions 15 and the neighboring portions thereof are removed in the same manner as in the above-mentioned case, as shown in FIG. 4(d). Finally, pad portions 18 are formed at the terminal portions 15 in the same manner as in the above-mentioned case, as shown in FIG. 4(e), to thereby produce the flexible wired circuit board 11.

According to this method as well, since semi-conductor layers 19, each comprising the thin metal film 16 and the metal oxide layer 17, are formed on the insulating base layer 12 and on the insulating cover layer 5, respectively, the electrostatic damage of the components mounted on the flexible wired circuit board 11 can be prevented effectively. Besides, differently from the case where only the thin metal film 16 is formed, excessive reduction of the value of the surface resistance can be prevented and accordingly the operation errors of the device can also be prevented effectively.

Further, the semi-conductor layer 19 having a uniform surface resistance which falls within the preferable range can be formed, as compared with the construction wherein the metal oxide layer 17 is formed directly on the insulating base layer 12 and the insulating cover layer 14 by the reactive sputtering or the sputtering using the metallic oxide target.

The thin metal film 16 and the metal oxide layer 17 may be formed on either of the insulating base layer 12 and the insulating cover layer 14, rather than on both of the insulating base layer 12 and the insulating cover layer 14 in the processes shown in FIG. 4.

EXAMPLES

While in the following, the present invention will be described in further detail with reference to Examples and Comparative Example, the present invention is not limited to any of the examples and comparative example.

Example 1

Liquid solution comprising photosensitive polyamide acid resin was applied to the metal supporting layer having an elongate stainless foil of 250 mm in length and 20 μm in thickness. Then, the liquid solution was exposed to light and developed, to form a predetermined pattern on the metal supporting layer and then was heated and cured, to form the insulating base layer (10 μm in thickness) comprising polyimide resin on the metal supporting layer. Sequentially, the conductor layer (15 μm in thickness) was formed in the form of a predetermined wired circuit pattern on the insulating base layer by the semi-additive process. Thereafter, the liquid solution comprising photosensitive polyamide acid resin was applied to the insulating base layer. Then, the liquid solution was exposed to light and developed, to form a predetermined pattern on the insulating base layer including the conductor layer and then was heated and cured, to form the insulating cover layer (3 μm in thickness) comprising polyimide resin on the insulating base layer including the conductor layer, to thereby produce the suspension board with circuit (See FIG. 1(a)). The suspension board with circuit is provided, at its portion where the insulating cover layer is opened, with the terminal portions where the conductor layer is exposed.

Then, the thin metal film formed by a thin chromium film was formed over the entire surface of the insulating cover layer and the entire surface of the terminal portions by sputtering (See FIG. 1(b)).

The sputtering was conducted in the same manner as in the above-mentioned case and measured in the following conditions.

Target: Cr
Ultimate vacuum: $8\times10^{-3}$ Pa
Flow rate of introduced gas (Argon): $1.8\times10^{-3}$ m$^3$/h Operating pressure: 0.27 Pa
Temperature of earth electrode: 20° C.
Electric power (Pulsed power supply): 125 W (Voltage: 227V, Current: 0.55 A)
Sputtering time: one minute
Thickness of thin metal film: 7 nm Sequentially, the surface of the thin metal film formed by thin chromium film was oxidized by heating at 125° C. for 12 hours in the atmosphere, whereby the metal oxide layer was formed on the thin metal film (See FIG. 1(c)). The presence of the metal oxide layer was confirmed by ESCA.

Then, the etching resist was formed on all areas of the suspension board with circuit but the terminal portions and the neighboring portions thereof by the photo lithography method. Then, the metal oxide layer and thin metal film corresponding to the terminal portions and neighboring portions thereof were removed by using the mixed aqueous solution of cerium ammon nitrate and nitrate as etchant (See FIG. 1(d)).

Thereafter, the pad portions were formed by electrolytic-plating the surface of the conductor layer at the terminal portions with nickel and gold in sequence (See FIG. 1(e)). Thereafter, the metal supporting layer was etched into a predetermined shape to thereby produce the suspension board with circuit having the metal oxide layer and thin metal film formed thereon.

Example 2

Except that the reactive sputtering was used as a substitute for the oxidation-by-heating method, to form the metal oxide layer in the following conditions, the same operations as in Example 1 were conducted to produce the suspension board with circuit having the metal oxide layer and thin metal film formed thereon.

Target: Cr
Ultimate vacuum: $8 \times 10^{-3}$ Pa
Flow rate of introduced gas: $Ar/O_2$ mixed gas:

Ar: $1.2 \times 10^{-3}$ m$^3$/h $O_2$: $1.2 \times 10^{-4}$ m$^3$/h

Operating pressure: 0.27 Pa
Temperature of earth electrode: 20° C.
Electric power (Pulsed power supply): 125 W (Voltage: 227V, Current: 0.55 A)
Sputtering time: one minute
Thickness of thin metal film: 7 nm

Comparative Example

Except that the metal oxide layer was formed directly on the insulating cover layer, without forming the thin metal film, by the reactive sputtering in the following conditions, the same operations as in Example 1 were conducted to produce the suspension board with circuit having the metal oxide layer and thin metal film formed thereon.

Target: Cr
Ultimate vacuum: $8 \times 10^{-3}$ Pa
Flow rate of introduced gas: $Ar/O_2$ mixed gas:

Ar: $1.8 \times 10^{-3}$ m$^3$/h $O_2$: $7.2 \times 10^{-5}$ m$^3$/h

Operating pressure: 0.27 Pa
Temperature of earth electrode: 20° C.
Electric power (Pulsed power supply): 125 W (Voltage: 227V, Current: 0.55 A)
Sputtering time: three minutes
Thickness of thin metal film: 20 nm

Evaluation

The surface resistance of the metal supporting layer (stainless steel) was measured at five locations in the widthwise direction of the metal supporting layer. The surface resistance was measured with a surface resistance measuring device (Hiresta-up MCP-HT450 available from Mitsubishi Chemical Corporation) at temperature of 25° C. and humidity of 15%. The results are shown in TABLE 2.

TABLE 2

| | Surface resistance ($\Omega/\square$) | | | | | Average | Standard deviation |
|---|---|---|---|---|---|---|---|
| Example 1 | 1.12E+05 | 2.11E+05 | 1.48E+05 | 3.06E+05 | 2.81E+05 | 2.12E+05 | 0.74E+05 |
| Example 2 | 1.22E+05 | 2.24E+05 | 1.55E+05 | 3.18E+05 | 2.99E+05 | 2.24E+05 | 0.77E+05 |
| Compara. Example 1 | 3.55E+04 | 1.16E+05 | 1.21E+07 | 4.87E+11 | 8.20E+12 | 1.74E+12 | 3.23E+12 |

It can be seen from TABLE 2 that the surface resistances in the Examples 1 and 2 vary narrowly, as compared with those in the Comparative example. It was also found that some of the surface resistances in the Comparative example 1 were beyond $10^{10} \Omega/\square$.

Example 3

Except that the sputtering using the metallic oxide target was used as a substitute for the oxidation-by-heating method, to form the metal oxide layer in the following conditions, the same operations as in Example 1 were conducted to produce the suspension board with circuit having the metal oxide layer and thin metal film formed thereon.

Target: $CrO_2$
Ultimate vacuum: $8 \times 10^{-5}$ Pa
Flow rate of introduced gas: $1.2 \times 10^{-3}$ m$^3$/h
Operating pressure: 0.27 Pa
Temperature of earth electrode: 20° C.
Electric power (RF power supply): 400 W
Sputtering time: one minute
Thickness of thin metal film: 7 nm While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A method of producing a wired circuit board comprising:
preparing a wired circuit board comprising a conductor layer, an insulating layer located adjacent to the conductor layer, and a terminal portion formed by the conductor layer exposed by opening the insulating layer, forming a thin metal film on a surface of the insulating layer and a surface of the terminal portion, forming a metal oxide layer on a surface of the thin metal film, and removing the thin metal layer and metal oxide layer formed on the surface of the terminal portion.

2. The method of producing the wired circuit board according to claim 1, wherein the thin metal layer is formed by sputtering in the step of forming the thin metal film on the surface of the insulating layer and the surface of the terminal portion.

3. The method of producing the wired circuit board according to claim 1, wherein the metal oxide layer is formed by oxidizing a surface of the metal oxide layer by heating in the step of forming the metal oxide layer on the surface of the thin metal film.

4. The method of producing the wired circuit board according to claim 1, wherein the metal oxide layer is formed by sputtering in the step of forming the metal oxide layer on the surface of the thin metal film.

5. The method of producing the wired circuit board according to claim 1, wherein the thin metal film is a thin chromium film and the metal oxide layer is a chromium oxide layer.

6. The method of producing the wired circuit board according to claim 1, wherein the thin metal film has a thickness of 3 to 7 nm, and the metal oxide layer is formed on the surface of the thin metal film to form a semi-conductor layer comprising the thin metal film and the metal oxide layer and having a surface resistance value of $10^4$ to $10^{10}$ $\Omega/\square$.

7. The method of producing the wired circuit board according to claim 5, wherein the insulating layer is an insulating cover layer, an insulating base layer is formed on a surface opposite to a surface located adjacent to the insulating cover layer of the conductor layer, and a metal supporting layer is formed on a surface opposite to a surface located adjacent to the conductor layer of the insulating base layer.

8. The method of producing the wired circuit board according to claim 6, wherein the insulating layer is an insulating cover layer, an insulating base layer is formed on a surface opposite to a surface located adjacent to the insulating cover layer of the conductor layer, and a metal supporting layer is formed on a surface opposite to a surface located adjacent to the conductor layer of the insulating base layer.

\* \* \* \* \*